United States Patent
Kang et al.

(10) Patent No.: US 7,256,449 B2
(45) Date of Patent: Aug. 14, 2007

(54) EEPROM DEVICE FOR INCREASING A COUPLING RATIO AND FABRICATION METHOD THEREOF

(75) Inventors: Sung-Taeg Kang, Seoul (KR); Seong-Gyun Kim, Gyeonggi-do (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/849,219

(22) Filed: May 20, 2004

(65) Prior Publication Data
US 2005/0051835 A1    Mar. 10, 2005

Related U.S. Application Data

(63) Continuation-in-part of application No. 10/834,226, filed on Apr. 29, 2004.

(30) Foreign Application Priority Data

May 20, 2003  (KR) ............ 10-2003-0031910
Sep. 1, 2003   (KR) ............ 10-2003-0060763
Sep. 26, 2003  (KR) ............ 10-2003-0066943

(51) Int. Cl.
*H01L 29/788* (2006.01)
(52) U.S. Cl. .................. 257/321; 257/316
(58) Field of Classification Search ......... 257/315, 257/318, 316, 321; 365/185.28
See application file for complete search history.

(56) References Cited

U.S. PATENT DOCUMENTS 4,699,690 A    10/1987  Arakawa
4,794,433 A    12/1988  Kamiya
5,200,636 A    4/1993   Uemura
5,326,999 A    7/1994   Kim
5,894,147 A *  4/1999   Cacharelis .............. 257/316
6,177,702 B1   1/2001   Kakoschke
6,472,259 B1   10/2002  Naito et al.
6,660,589 B2 * 12/2003  Park ....................... 438/257

FOREIGN PATENT DOCUMENTS

DE    19951930     7/2000
JP    2-277269     11/1990
JP    11-274326    8/1999

OTHER PUBLICATIONS

Park, W.H., "Non-volatile memory," Derwent-Acc-No. 2003-145275, Patent Pub-Date Aug. 28, 2002.*
German Office Action dated Sep. 15, 2005.
Korean Patent Office Action dated Aug. 25, 2005.
Chinese Patent Office Action dated Mar. 9, 2007, for corresponding Chinese Patent Application No. 2004100631378.

* cited by examiner

*Primary Examiner*—Sara Crane
(74) *Attorney, Agent, or Firm*—Harness, Dickey & Pierce, P.L.C.

(57) ABSTRACT

An electrically erasable and programmable read only memory (EEPROM) device may include: a gate oxide layer on a semiconductor substrate, the gate oxide layer including a first segment of a first thickness, a second segment of a second thickness, and a tunneling third segment of a third thickness, the second thickness being thicker than the first thickness and the third thickness being thinner than the first thickness; a floating junction region formed under a portion of the gate oxide layer in the semiconductor substrate; and a floating gate, an insulating layer pattern, and a control gate which are sequentially formed, respectively, on the gate oxide layer.

13 Claims, 4 Drawing Sheets

US 7,256,449 B2

1

EEPROM DEVICE FOR INCREASING A COUPLING RATIO AND FABRICATION METHOD THEREOF

This application claims the priorities of Korean Patent Application No. 2003-31910 filed on May 20, 2003, No. 2003-60763 filed on Sep. 1, 2003, and No. 2003-66943 filed on Sep. 26, 2003, the disclosures of which are incorporated herein in their entirety by reference.

This application also is a continuation-in-part of copending U.S. patent application having Ser. No. 10/834,226 and filed Apr. 29, 2004, for which priority is claimed under 35 U.S.C. § 120, and the disclosure of which is incorporated herein in its entirety.

BACKGROUND OF THE INVENTION

In general, there are various types of semiconductor memory devices such as Random Access Memory (RAM) and Read Only Memory (ROM). When power supply is disconnected, information stored in Random Access Memory (RAM) is lost, whereas information stored in Read Only Memory (ROM) is maintained. Therefore, the ROM is called a non-volatile memory device. An Electrically Erasable and Programmable Read Only Memory (EEPROM) device is a kind of a non-volatile memory device on which data can be electrically erased and programmed.

FIG. 1 is a cross-sectional view of an EEPROM device 8 according to the Background Art, that includes a memory transistor (MTR) and a corresponding selection transistor (STR). Referring to FIG. 1, a memory gate oxide layer 12 and a tunneling oxide layer 14 are formed on a semiconductor substrate 10. The thickness of the tunneling oxide layer 14 is thinner than that of the memory gate oxide layer 12. A floating gate 16 is formed on the memory gate oxide layer 12 and the tunneling oxide layer 14. Also, an insulating layer 18 and a control gate 20 are sequentially formed on the floating gate 16.

In the semiconductor substrate 10, a source region 22 is formed to be aligned with respect to sides of the floating gate 16 and the control gate layer 18. Viewing the memory transistor MTR as having a right half and a left half, a floating junction region 24 is formed under the right half of the MTR, and consequently is underneath the tunneling oxide layer 14. The source region 22 and the floating junction region 24 are N$^+$ regions when the semiconductor substrate 10 is a P-type silicon substrate. The tunneling oxide layer 14, the floating gate 16, the insulating layer 18, the control gate 20, the source region 22, and the floating junction region 24 constitute the memory transistor MTR.

Being separated from the memory transistor MTR, a selection gate oxide layer 26 is formed on the semiconductor substrate 10. A gate 34, which includes a first conductive layer pattern 28, an insulating layer pattern 30, and a second conductive layer pattern 32, is formed on the selection gate oxide layer 26. A drain region 36 is formed under the right side of the gate 34. The drain region 36 is connected to a bit line (not shown). The drain region 36 is an N$^+$ region when the semiconductor substrate 10 is a P-type silicon substrate. The selection gate oxide layer 26, the gate 34, the floating junction region 24, and the drain region 36 constitute the selection transistor STR.

Such a structure of the Background Art EEPROM device 8 causes a difference between voltages applied to the control gate 20 and the floating junction region 24 and thus makes Fowler-Nordheim (F-N) current flow through the tunneling oxide layer 14. Therefore, a memory cell of the EEPROM

2 device 8 is erased or programmed by injecting electrons into or discharging electrons from the floating gate 16. In detail, implantation of electrons into the floating gate 16 causes erasure of the cell and discharge of electrons from the floating gate 16 causes programming of the cell.

An operating voltage used for the programming and erasure of the cell is determined by a coupling ratio, i.e., the extent that a voltage applied to the control gate 20 is applied to the floating gate 16. The coupling ratio is required to be increased to reduce the operating voltage. However, as the size of a cell of the EEPROM device 8 becomes smaller, a capacitance value between the floating gate 16 and the control gate 20 becomes reduced and the coupling ratio also decreases.

In the Background Art, it is known to increase the coupling ratio by reducing the thickness of an insulating layer between the floating gate 16 and the control gate 20 so as to increase a capacitance value therebetween, or reducing the size of the tunneling oxide layer 14. However, there is a limitation in lowering the thickness of the insulating layer 18 because it may result in charge loss. Also, there is a limitation in reducing the size of the tunneling oxide layer 14 using a patterning process. As a worst case scenario, a reduction in the size of the tunneling oxide layer 14 reduces the reliability of a memory device.

SUMMARY OF THE INVENTION

At least one embodiment of the present invention provides an Electrically Erasable and Programmable Read Only Memory (EEPROM) device capable of increasing a coupling ratio while overcoming the problems of the conventional EEPROM device.

At least one embodiment of the present invention also provides a method of fabricating such an EEPROM device.

At least one embodiment of the present invention provides an electrically erasable and programmable read only memory (EEPROM) device. Such an EEPROM device may include: a gate oxide layer on a semiconductor substrate, the gate oxide layer including a first segment of a first thickness, a second segment of a second thickness, and a tunneling third segment of a third thickness, the second thickness being thicker than the first thickness and the third thickness being thinner than the first thickness; a floating junction region formed under a portion of the gate oxide layer in the semiconductor substrate; and a floating gate, an insulating layer pattern, and a control gate which are sequentially formed, respectively, on the gate oxide layer.

Additional features and advantages of the invention will be more fully apparent from the following detailed description of example embodiments, the accompanying drawings and the associated claims.

BRIEF DESCRIPTION OF THE DRAWINGS

The above and other aspects and advantages of the present invention will become more apparent by describing in detail example embodiments thereof with reference to the attached drawings in which.

DETAILED DESCRIPTION OF THE INVENTION

Figure 1:
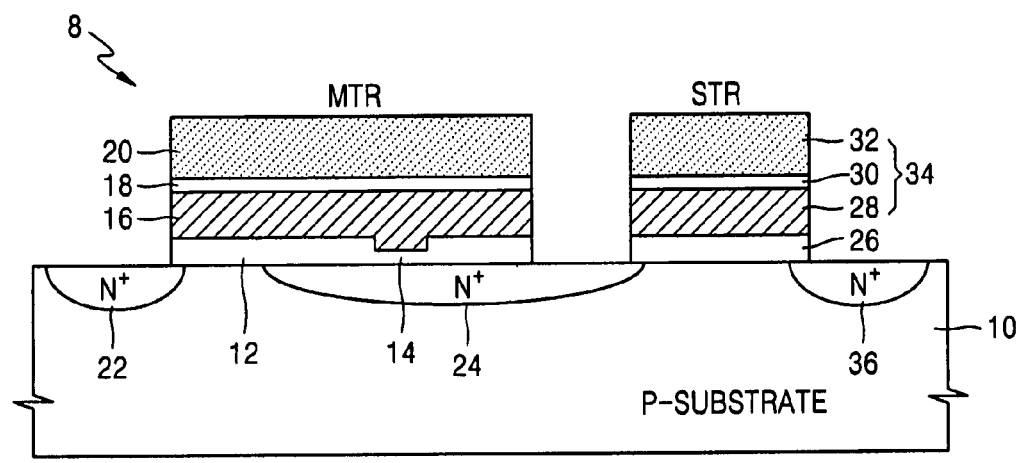
FIG. 1 is a cross-sectional view of an Electrically Erasable and Programmable Read Only Memory (EEPROM) device according to the Background Art.

The present invention will now be described more fully with reference to the accompanying drawings, in which example embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. Characteristics, such as shape and thickness, of elements shown in the drawings may be exaggerated for clarity. Or, in other words, the drawings are not drawn to scale. The same reference numerals represent the same elements throughout the drawings.

Figure 2:
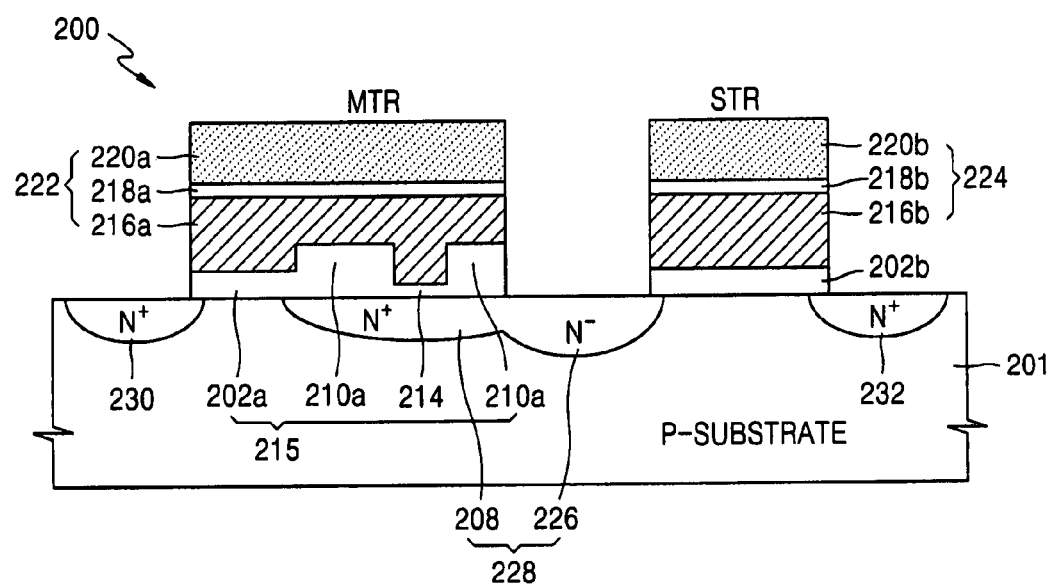
FIG. 2 is a cross-sectional view of an Electrically Erasable and Programmable Read Only Memory (EEPROM) device according to at least one embodiment of the present invention.

FIG. 2 is a cross-sectional view of a cell of an Electrically Erasable and Programmable Read Only Memory (EEPROM) device 200 according to at least one embodiment of the present invention.

More specifically, a memory transistor MTR and a selection transistor STR spaced apart therefrom are formed on a semiconductor substrate 201, e.g., a P-type silicon substrate. The memory transistor MTR includes a memory gate oxide layer 215 on the semiconductor substrate 201. A portion 214 of the memory gate oxide layer 215 will be referred to as a tunneling oxide layer 214.

The memory gate oxide layer 215 is organized into parts that are referred to as follows: a first memory gate oxide layer 202a that is formed to a first thickness; and a second memory gate oxide layer 210a that is formed to a second thickness on a floating junction region 228 and has portions to the left and right of the tunneling oxide layer 214. The first thickness is thinner than the second thickness. The tunneling oxide layer 214 is formed to a third thickness, which is also thinner than the first thickness of the first memory gate oxide layer 215, in the second memory gate oxide layer 210a. The first memory gate oxide layer 202a is adjacent to a source region 203.

A floating gate 216a is formed on the memory gate oxide layer 215 and the tunneling oxide layer 214. An insulating layer 218a and a control gate 220a are sequentially formed on the floating gate 216a. An upper surface of the floating gate 216a can be planar. The floating gate 216a, the insulating layer 218a, and the control gate 220a are included as parts of a gate stack 222 of the memory transistor MTR. The insulating layer 218a may be an oxide-nitride-oxide (ONO) layered structure.

The source region 230, as depicted in FIG. 2, is formed in the semiconductor substrate 201 at the left side of the first memory gate oxide layer 202a on the semiconductor substrate 201. A floating junction region 228, which includes a first impurity region 208 and a second impurity region 226, is formed in the semiconductor substrate 201 substantially underneath the second memory gate oxide layer 210a and the tunneling oxide layer 214 and at the right side of the memory transistor MTR in a region between the memory transistor MTR and the selection transistor STR. The first and second impurity regions 208 and 226 may be an N$^+$ impurity region and an N$^-$ impurity region, respectively, when the semiconductor substrate 201 is a P-type silicon substrate. In this case, the floating junction region 228 may include N$^+$ and N$^-$ impurity regions.

The selection transistor STR includes a selection gate oxide layer 202b that is formed on the semiconductor substrate 201. A gate 224, which includes a first conductive layer pattern 216b, an insulating layer pattern 218b, and a second conductive layer pattern 220b, is formed on the selection gate oxide layer 202b. A drain region 232 is formed in the semiconductor substrate 201 at the right side of the gate 224. The drain region 232 is connected to a bit line (not shown). The source region 230, the floating junction region 228, and the drain region 232 may be N-type impurity regions when the semiconductor substrate 201 is a P-type silicon substrate. A thickness of the selection gate oxide layer 202b can be, e.g., substantially the same as the first thickness, namely the thickness of the first memory gate oxide layer 202a.

The memory transistor MTR shown in FIG. 2 is constructed such that the thickness of the second memory gate oxide layer 210a formed in the floating junction region 228 is thicker than that of the first memory gate oxide layer 202a, thereby increasing a coupling ratio during injecting/discharging of electrons into/from a cell, i.e., during erasing/programming of the cell. More specifically, the coupling ratios during the injection of electrons into the cell, i.e., erasing of the cell, and during the discharge of electrons from the cell, i.e., programming of the cell, can be expressed, respectively, as follows:

$$\gamma = C_{ono}/C_{total} = C_{ono}/(C_{tunnel} + C_{gox} + C_{ono}) \quad (1),$$

$$\gamma = C_{ono} + C_{gox}/C_{total} = C_{ono} + C_{gox}/(C_{tunnel} + C_{gox} + C_{ono}) \quad (2),$$

wherein $C_{ono}$ denotes a capacitance between the control gate 220a and the floating gate 216a, $C_{tunnel}$ denotes a capacitance between the floating gate 216a and the semiconductor substrate 201 including the tunneling oxide layer 214, $C_{gox}$ denotes a capacitance between the floating gate 216a and the floating junction region 228 under the second memory gate oxide layer 210a, and $C_{total}$ denotes $C_{tunnel} + C_{gox} + C_{ono}$.

As previously mentioned, the capacitance $C_{gox}$ in the EEPROM device 200 becomes reduced since the second memory gate oxide layer 210a formed on the floating junction region 228 is thicker than that in the Background Art EEPROM device 8. Since the capacitance $C_{gox}$ are denominators of the fractions shown in Equations (1) and (2), the coupling ratio of the EEPROM device 200 is higher than that of the Background Art EEPROM device 8. As the coupling ratio increases, the size of the cell of the EEPROM device 200 can be lessened. In addition, when the coupling ratio increases, it is possible to lower an operating voltage during erasing or programming of the cell of the EEPROM device 200.

FIGS. 3 through 10 are cross-sectional views explaining various stages of a method of fabricating the EEPROM device 200 of FIG. 2, according to at least one embodiment of the present invention.

Figure 3:
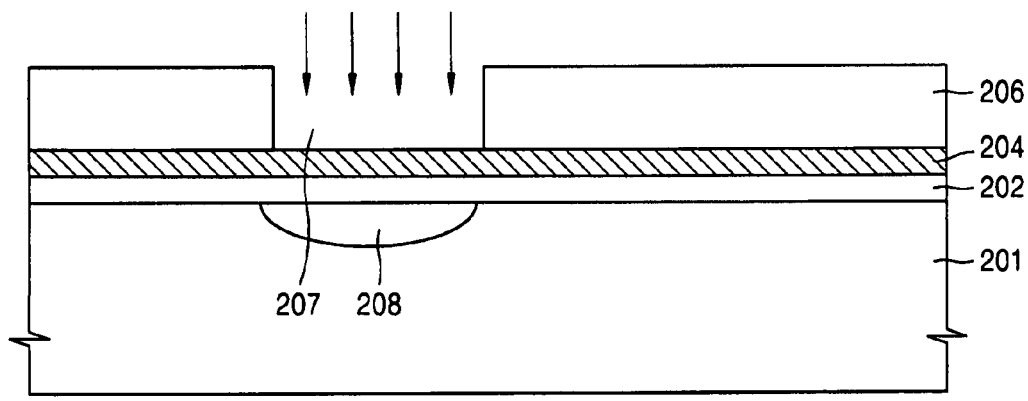
FIGS. 3 through 10 are cross-sectional views explaining various stages of a method of fabricating the EEPROM device of FIG. 2, according to at least one other embodiment of the present invention.

Referring to FIG. 3, a first oxide layer 202 is formed on a semiconductor substrate 201, e.g., a P-type silicon substrate. The first oxide layer 202 eventually will be patterned to form a memory gate oxide layer of a memory transistor MTR and a selection gate oxide layer of a selection transistor STR during a subsequent process. As an example implementation of device 200 (provided to accompany the discussion of FIGS. 3-10), the first oxide layer 202 can be formed to a thickness from about 250 to about 280 Å.

Next, a nitride layer 204 is formed on the first oxide layer 202. Then a first photoresist pattern 206 having a gap 207 is formed on the nitride layer 204. During a subsequent process, the gap 207 in the first photoresist pattern 206 will be used to expose a portion of the semiconductor substrate 201 for ion implementation of impurities such as N-type impurities so as to obtain a first impurity region 208 (or, in other words, a tunneling region). The first impurity region 208 represents a part of a floating junction region. The first impurity region 208 can be, e.g., formed of $N^+$ impurities. Continuing with the example implementation, the first impurity region 208 can be formed by implanting phosphorus (P) at a dose from about $7.0E13/cm^2$ up to about $1.0E14/cm^2$ at an energy from about 50 up to about 70 KeV, or implanting arsenic (As) at a dose from about $7.0E13/cm^2$ up to about $1.5E14/cm^2$ at an energy from about 60 up to about 120 KeV.

Figure 4:
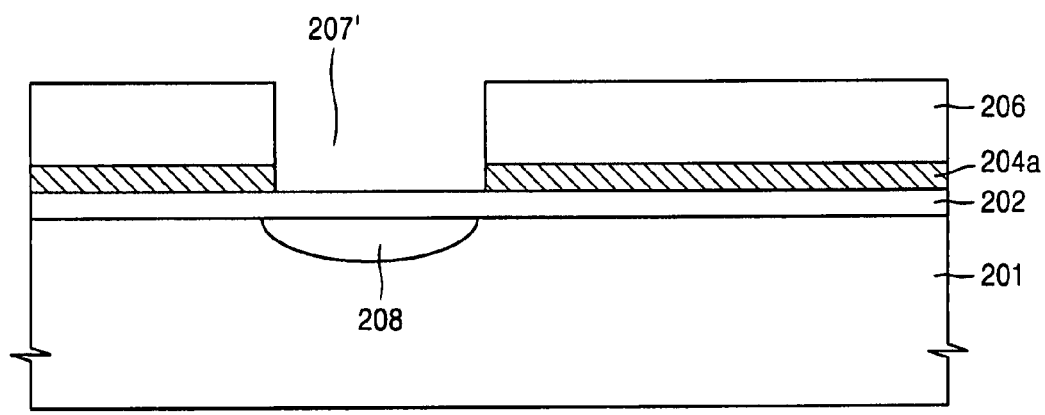

Referring to FIG. 4, the nitride layer 204 is selectively etched using the first photoresist pattern 206 as a mask. As a result, a nitride layer pattern 204a is formed, making the gap 207 deeper (now 207') to expose a portion of the first oxide layer 202 that is located over the first impurity region 208.

Figure 5:
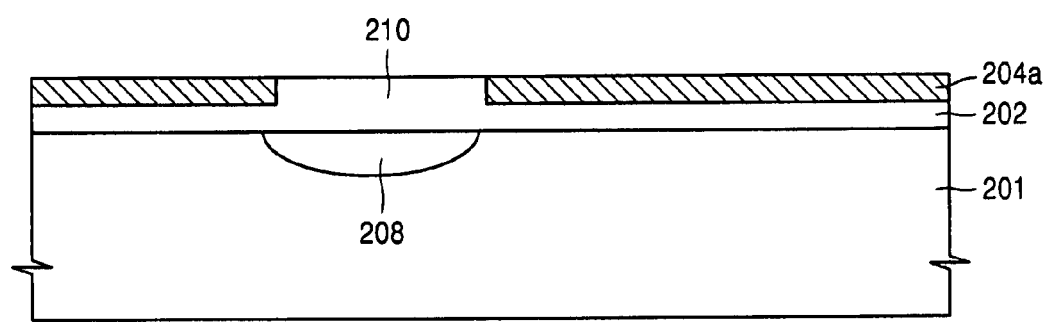

Referring to FIG. 5, the first photoresist pattern 206 is removed. Then, the exposed portion 210 of the first oxide layer 202 (hereafter, second oxide layer 210) is increased in thickness. That is, the second oxide layer 210, which is thicker than the first oxide layer 202, can be formed by, e.g., oxidizing the semiconductor substrate 201 with the nitride layer pattern 204a being used as an anti-oxidation mask. The second oxide layer 210 will become a second memory gate oxide layer on the first impurity region (floating junction region) during a subsequent process. The difference in thickness between the first oxide layer 202 and the second oxide layer 210 corresponds to (and so can be controlled by) the thickness of the nitride layer pattern 204a.

Figure 6:
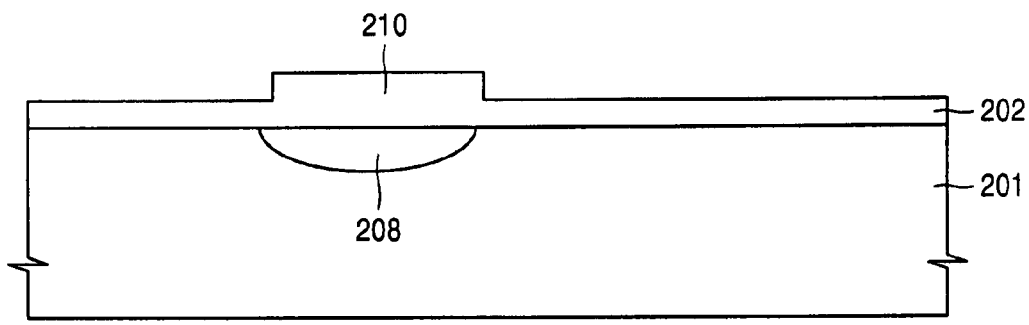

Referring to FIG. 6, the nitride layer pattern 204a is removed. As a result, the first oxide layer 202 is formed on the semiconductor substrate 201 and the second oxide layer 210, which is thicker than the first oxide layer 202, is formed on the first impurity region 208.

Figure 7:
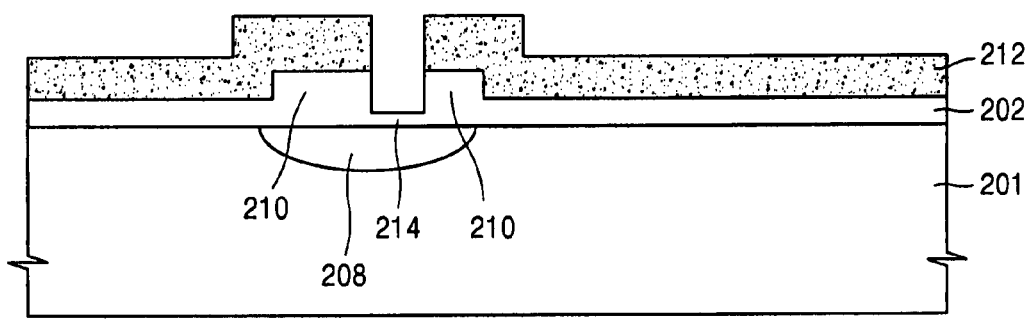

Referring to FIG. 7, a second photoresist pattern 212 is formed and then patterned to expose a portion of the second oxide layer 210. The second photoresist pattern 212 is a mask by which a subsequent process can form a tunneling oxide layer. Next, the second oxide layer 210 is etched using the second photoresist pattern 212 as a mask so as make thinner a portion 214 of the second oxide layer 210, the portion 214 hereafter being referred to as tunneling oxide layer 214. The tunneling oxide layer 214 has a third thickness which is thinner than the first thickness of the first oxide layer 202. Continuing with the example implementation, the tunneling oxide layer 214 may be formed to a thickness from about 70 to about 80 Å.

Figure 8:
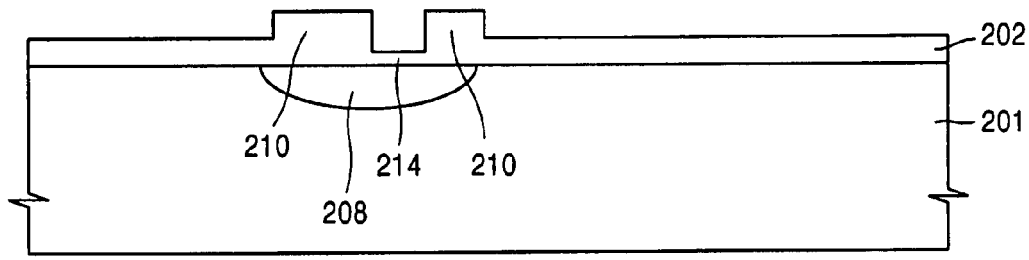

Referring to FIG. 8, the second photoresist pattern 212 is removed. As a result, the semiconductor substrate 201 includes the first oxide layer 202 of the first thickness, the second oxide layer 210 of the second thickness, and the tunneling oxide layer 214 of the third thickness. Here, the second thickness is thicker than the first thickness and third thickness is thinner than the first thickness. The second oxide layer 210 and the tunneling oxide layer 214 are formed on the first impurity region (floating junction region) 208.

Figure 9:
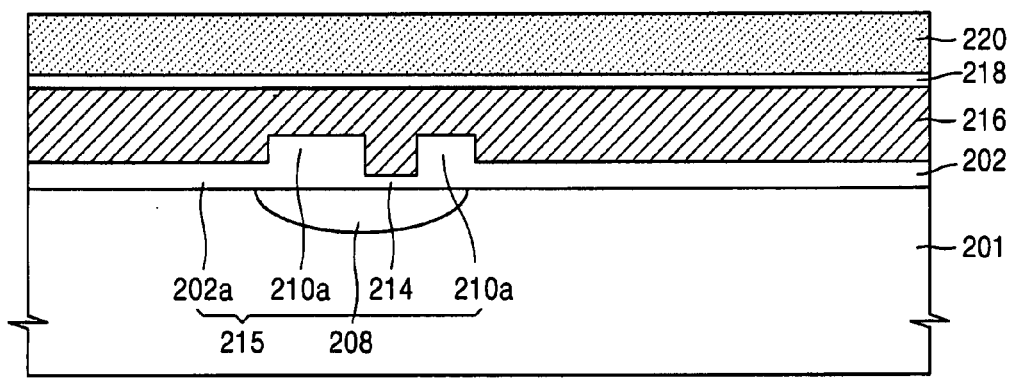

Referring to FIG. 9, a first conductive layer 216 is formed on the entire upper surface of the semiconductor substrate 201 on which the first oxide layer 202, the tunneling oxide layer 214, and the second oxide layer 210 are sequentially formed. The first conductive layer 216 can be an impurities-doped polysilicon layer. The first conductive layer 216 can be formed to have a planar upper surface. An insulating layer 218, e.g., an ONO layered structure, is formed on the first conductive layer 216. A second conductive layer 220 is formed on the insulating layer 218. Similarly, the second conductive layer 220 is also an impurities-doped polysilicon layer and formed to a thickness from 1000 up to 2000 Å.

Figure 10:
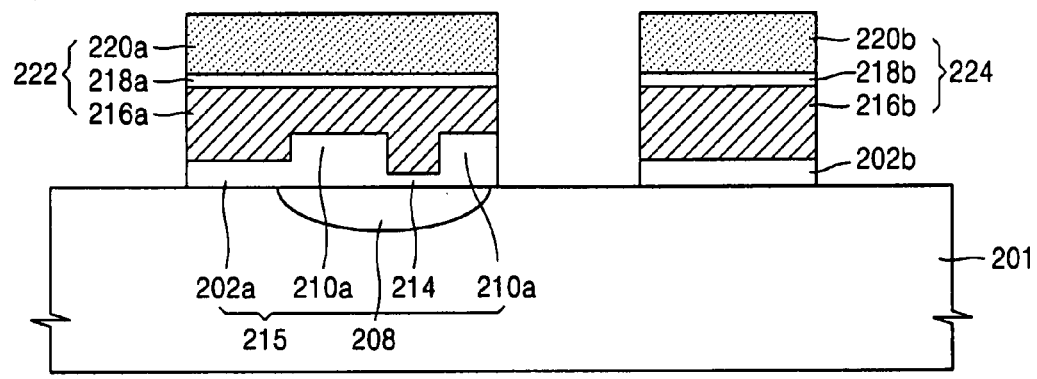

Referring to FIG. 10, the second conductive layer 220, the insulating layer 218, the first conductive layer 216, the second oxide layer 210, and the first oxide layer 202 are sequentially patterned, the remains thereof representing: a gate stack 222 and a memory gate oxide layer 215 of an inchoate memory transistor MTR; and a gate stack 224 and a selection gate oxide layer 202b of an inchoate selection transistor STR.

The gate stack 222 of the inchoate memory transistor MTR includes a floating gate 216a, an insulating layer 218a, and a control gate 220a. The memory gate oxide layer 215 includes a first memory gate oxide layer 202a of the first thickness and a second memory gate oxide layer 210a of the second thickness that is thicker than the first thickness. The tunneling oxide layer 214 (again, a portion of the second oxide layer 210) is formed to the third thickness that is thinner than the first thickness. The gate stack 224 of the inchoate selection transistor STR includes a second conductive layer pattern 220b, an insulating layer pattern 218b, and a first conductive layer pattern 216b. The selection gate oxide layer 202b of the selection transistor can have, e.g., substantially the same thickness as the first memory gate oxide layer 202a.

Thereafter, as shown in FIG. 2, a second impurity region 226 is formed in the semiconductor substrate 201 so as to be aligned with respect to a sidewall of the gate stack 222 and a sidewall of the gate stack 224. The first and second impurity regions 208 and 226 are included as parts of a floating junction region 208. In other words, the second impurity region 226 is formed between the gate stack 222 of the inchoate memory transistor MTR and the gate stack 224 of the inchoate selection transistor STR, and the first and second impurity regions 208 and 226 together become a floating junction region 208. Continuing with the example implementation, if the semiconductor substrate 201 is a P-type silicon substrate, then the second impurity region 226 can be formed as an $N^-$ impurity region by implanting phosphorous (P) into the semiconductor substrate 201 at a dose from about $5.0E12/cm^2$ to about $1.2E13/cm^2$ at energy from about 70 KeV to about 120 KeV.

Next, a source region 230 is formed in the semiconductor substrate 201 so as to be aligned with respect to the other sidewall of the gate stack 222, and a drain region 232 is formed in the semiconductor substrate 201 to be aligned with respect to the other sidewall of the gate 224. That is, the source region 230 is formed at the left side of the gate stack 222 of the memory transistor and the drain region 232 is formed at the right side of the gate 224 of the selection transistor. Continuing with the example implementation, if the semiconductor substrate 201 is a P-type silicon substrate, then the source region 230 and the drain region 232 are formed as an $N^+$ impurity region by implanting arsenic (As) into the semiconductor substrate 201 at a dose from about $9.0E14/cm^2$ to about $9.0E15/cm^2$ at an energy from about 30 KeV to about 80 KeV.

As described above, in an EEPROM device according to at least one embodiment of the present invention, a coupling ratio can be increased by increasing the thickness of a second memory gate oxide layer on a floating junction region while maintaining the size and thickness of a tunneling oxide layer. As the coupling ratio increases, it is possible to reduce the size of a cell of the EEPROM device and lower an operating voltage during erasing or programming of the cell.

The invention being thus described, it will be obvious that the same may be varied in many ways. Such variations are not to be regarded as a departure from the spirit and scope of the invention, and all such modifications are intended to be included within the scope of the invention.

What is claimed is:

1. An electrically erasable and programmable read only memory (EEPROM) device comprising:
    a gate oxide layer on a semiconductor substrate, the gate oxide layer including a first segment of a first thickness, a second segment of a second thickness, and a tunneling third segment of a third thickness, the second thickness being thicker than the first thickness and the third thickness being thinner than the first thickness;
    a floating junction region formed under a portion of the gate oxide layer in the semiconductor substrate; and
    a floating gate, an insulating layer pattern, and a control gate which are sequentially formed, respectively, on the gate oxide layer;
    the first segment being positioned over a region in the semiconductor substrate located between a source region and the floating junction region.

2. The EEPROM device of claim 1, wherein the floating junction region includes an $N^+$ impurity region and an $N^-$ impurity region when the semiconductor substrate is a P-type silicon substrate.

3. An electrically erasable and programmable read-only (EEPROM) device comprising:
    a memory transistor and a selection transistor on a semiconductor substrate;
    the memory transistor including
        a memory gate oxide layer including a first segment of a first thickness, a second segment of a second thickness, and a tunneling third segment of a third thickness, the second thickness being thicker than the first thickness, and the third thickness being thinner than the first thickness,
        a memory floating gate, an insulating layer pattern, and a control gate which are sequentially formed, respectively on the memory gate oxide layer,
        a source region formed in the semiconductor substrate and aligned with respect to one sidewall of the floating gate and the control gate, and
        a floating junction region formed in the semiconductor substrate and aligned with respect to the other sidewall of the floating gate and the control gate and also extending under the second segment and tunneling third segment of the memory gate oxide layer,
        the first segment being positioned over a region in the semiconductor substrate located between a source region and the floating junction region; and
    the selection transistor including
        a selection gate oxide layer,
        a selection gate structure formed on the selection gate oxide layer, and
        a drain region formed in the semiconductor and with respect to one sidewall of the gate electrode structure;
    the floating junction region also being aligned with the other sidewall of the gate electrode structure of the selection transistor.

4. The EEPROM device of claim 3, wherein the source region of the memory transistor and the drain region of the selection transistor are $N^+$ impurity regions when the semiconductor substrate is a P-type silicon substrate.

5. The EEPROM device of claim 3, wherein the floating junction region includes an $N^-$ impurity region and an $N^+$ impurity region when the semiconductor substrate is a P-type silicon substrate.

6. The EEPROM of claim 1, wherein the gate oxide layer also has a fourth segment on an opposite side of the tunneling third segment relative to the second segment.

7. The EEPROM of claim 6, wherein the fourth segment is of substantially the same thickness as the second segment.

8. The EEPROM of claim 3, wherein the memory gate oxide layer also has a fourth segment on an opposite side of the tunneling third segment relative to the second segment.

9. The EEPROM of claim 8, wherein the fourth segment is of substantially the same thickness as the second segment.

10. The EEPROM of claim 3, wherein the selection gate oxide layer is of substantially the same thickness as the second segment of the memory gate oxide layer.

11. The EEPROM of claim 1, wherein an upper surface of the floating gate is substantially planar.

12. The EEPROM of claim 3, wherein an upper surface of the memory floating gate is substantially planar.

13. The EEPROM of claim 12, wherein the selection gate structure includes a selection floating gate, an upper surface of which is substantially coplanar with the upper surface of the memory floating gate.

* * * * *